US010069460B2

(12) United States Patent
Groene et al.

(10) Patent No.: US 10,069,460 B2
(45) Date of Patent: Sep. 4, 2018

(54) DETERMINING THE POWER DENSITY DISTRIBUTION OF A PHOTOVOLTAIC GENERATOR FROM TEMPORAL PROFILES OF ITS ELECTRICAL POWER

(71) Applicant: SMA Solar Technology AG, Niestetal (DE)

(72) Inventors: Matthias Groene, Kassel (DE); Jens Klein, Goetting (DE)

(73) Assignee: SMA Solar Technology AG, Niestetal (DE)

( * ) Notice: Subject to any disclaimer, the term of this patent is extended or adjusted under 35 U.S.C. 154(b) by 83 days.

(21) Appl. No.: 14/977,866

(22) Filed: Dec. 22, 2015

(65) Prior Publication Data

US 2016/0181974 A1    Jun. 23, 2016

(30) Foreign Application Priority Data

Dec. 23, 2014   (DE) .................. 10 2014 119 607

(51) Int. Cl.
| | | |
|---|---|---|
| G01R 21/133 | (2006.01) | |
| H02S 50/10 | (2014.01) | |
| H02S 50/00 | (2014.01) | |
| G01R 21/06 | (2006.01) | |

(52) U.S. Cl.
CPC .............. H02S 50/10 (2014.12); H02S 50/00 (2013.01); G01R 21/06 (2013.01)

(58) Field of Classification Search
CPC ............ G01R 29/0814; G01R 29/0842; G01R 31/2642; G01R 31/26; G01R 31/40; G01R 31/42; F21S 8/006; H01L 22/00; H01L 31/04; H01L 51/0031

USPC .............................................. 324/72, 761.01
See application file for complete search history.

(56) References Cited

U.S. PATENT DOCUMENTS

| | | | | |
|---|---|---|---|---|
| 2009/0066357 | A1* | 3/2009 | Fornage .................. | H02S 50/10 324/764.01 |
| 2010/0204844 | A1* | 8/2010 | Rettger ..................... | H02J 3/06 700/291 |
| 2011/0267090 | A1* | 11/2011 | Krebs ...................... | H02S 50/10 324/761.01 |
| 2012/0068687 | A1 | 3/2012 | Magnussen et al. | |
| 2012/0310427 | A1* | 12/2012 | Williams ................. | G05F 1/67 700/287 |
| 2012/0323507 | A1 | 12/2012 | Hasegawa et al. | |
| 2013/0148100 | A1* | 6/2013 | Magnussen .............. | G01C 3/08 356/4.07 |

(Continued)

FOREIGN PATENT DOCUMENTS

DE        102010003095 A1    9/2011

*Primary Examiner* — Tung X Nguyen
*Assistant Examiner* — Robert P Alejnikov, Jr.
(74) *Attorney, Agent, or Firm* — Eschweiler & Potashnik, LLC

(57) ABSTRACT

The power density distribution of a photovoltaic generator of planar extent is determined by measuring an electrical power generated by the photovoltaic generator. Temporal profiles of the measured power with respect to shadow edges migrating across the photovoltaic generator are evaluated taking account of edge direction and edge transverse speed of the respective shadow edge. The power density distribution is reconstructed from the evaluated temporal profiles for different edge directions.

11 Claims, 9 Drawing Sheets

(56) References Cited

U.S. PATENT DOCUMENTS

2014/0267391 A1\* 9/2014 Cummings ........... G06T 11/206
   345/629

\* cited by examiner

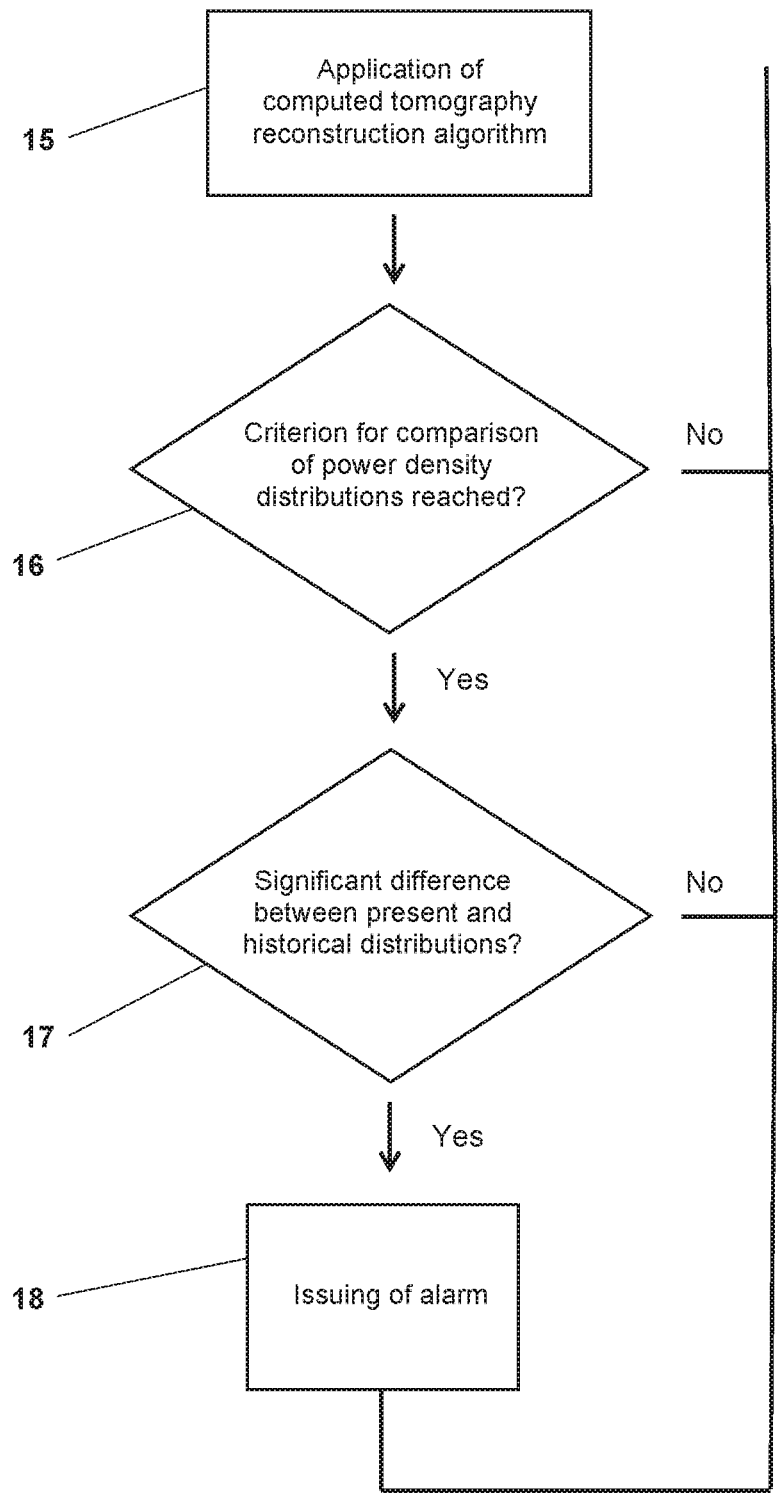

DETERMINING THE POWER DENSITY DISTRIBUTION OF A PHOTOVOLTAIC GENERATOR FROM TEMPORAL PROFILES OF ITS ELECTRICAL POWER

REFERENCE TO RELATED APPLICATION

This Application claims priority to German Application number 10 2014 119 607.4 filed on Dec. 23, 2014, the contents of which are incorporated by reference in their entirety.

FIELD

The disclosure relates to a method for determining a power density distribution of a photovoltaic generator. Furthermore, the disclosure relates to a monitoring device for a photovoltaic generator of planar extent, which monitoring device measures a power value of the electrical power generated by the photovoltaic generator.

BACKGROUND

DE 10 2010 037 582 A1 discloses a method for determining a spatial arrangement of photovoltaic module groups, i.e. of individual photovoltaic generators, of a photovoltaic installation. A sequence of measurement values of a radiation-dependent electrical characteristic variable of the individual photovoltaic module groups, for example the power generated by them, is measured while the photovoltaic installation is exposed to light irradiation with a temporally and spatially varying irradiation intensity owing to drifting clouds. The relative spatial arrangement of the photovoltaic module groups with respect to one another is determined from time shifts between the sequences of measurement values in the case of the different photovoltaic module groups. In this case, weather data, in particular wind speed and wind direction, can be taken into account, which can be ascertained from the image data of a camera. In addition, the extent of the photovoltaic module groups can be determined. The extent of the photovoltaic module groups directly influences the width of a fall and/or rise in the detected electrical characteristic variable, such that statements about the lateral extent of the module groups in the respective cloud drifting direction are possible from an analysis of these transition widths. If a plurality of drifting directions is taken into account, information about the shape and area extent of the photovoltaic module groups considered is obtained in this way.

DE 10 2011 056 207 A1 discloses a method for localizing stationary objects which bring about temporary shadings of light-sensitive components of a photovoltaic installation with a sun shadow. At least one electrical signal from the light-sensitive components is analyzed with regard to the occurrence of shading brought about by a stationary object. The direction of the object bringing about the shading is deduced from the positions of the sun when the shading occurs. In addition, the at least one electrical signal is analyzed with regard to the migration of the sun shadow of the object over the light-sensitive components with the changing position of the sun and the distance of the object bringing about the shading is deduced therefrom. The light-sensitive components can be solar cells, solar modules composed of solar cells, strings composed of solar modules or additionally provided sunlight sensors of the photovoltaic installation. The electrical signal can be the electrical power of the light-sensitive components. From the electrical signal it is also possible to deduce whether the changes thereof with the changing position of the sun indicate shading brought about by a non-stationary object. Such shading is not present if the direction in which the sun shadow moves across the light-sensitive components of the photovoltaic installation is not opposite to the change in the position of the sun. The speed at which the sun shadow moves across the light-sensitive components of the photovoltaic installation also matches shading by a stationary object only within specific limits. Conversely, fast migration of a sun shadow over the light-sensitive components of a photovoltaic installation indicates a shading obstacle travelling past or flying past. The analyzed electrical signal can originate from a single light-sensitive component of the photovoltaic installation with an extent in the direction of the migration of the sun shadow. The signal changes as soon as the leading shadow edge of the sun shadow reaches the light-sensitive component. This change continues until the light-sensitive component is maximally shaded by the respective shading obstacle. A change in the electrical signal in the opposite direction commences when the sun shadow increasingly releases the respective light-sensitive component again, which begins as soon as its trailing shadow edge reaches the light-sensitive component.

US 2010/0204844 A1 discloses a method for controlling a system for generating electrical power. In that case, a power source affected by geographically progressing states, e.g. weather states, is monitored in order to detect changes in its power output. Characteristics of the observed changes are analyzed in order to ascertain whether the changes are caused by a geographically progressing state that might influence other power sources in the vicinity. This information is used to extrapolate imminent power output changes for the same and other power sources. The extrapolations enable the power generating system to maintain the total power output within operating requirements. For example clouds passing over a photovoltaic array cause fluctuations in the power output if they shade the individual panels. If the power generated by the individual panels or sub-arrays at known locations is tracked over time, the speed and direction of the temporary shading fluctuations can be calculated. If the speed and direction are known, calculations can predict which other arrays will be affected in the same way and at which time.

In computed tomography, absorption profiles of an object are determined from different directions and a volume structure of the object is reconstructed from the absorption profiles. The reconstruction is based on the fact that the total absorption occurring along each path through the object is the integral of the specific absorption or absorption density along the path through the object. If total absorptions for different, intersecting paths are present, the local absorption density can be calculated therefrom. For evaluation of absorption profiles by computed tomography, various algorithms in the form of commercial programmes are available which determine the volume structure of the respective object from absorption profiles recorded in a comparatively small number of different directions, and do so robustly with respect to displacements of the object that occur during the recording of the absorption profiles.

SUMMARY

The present disclosure comprises a method for determining a power density distribution of a photovoltaic generator and a monitoring device for a photovoltaic generator of planar extent. The monitoring device measures a power value of the electrical power generated by the photovoltaic generator, with which a localization of faults and defects which occur in the photovoltaic generator is possible on a small data base.

A method according to the disclosure for determining a power density distribution of a photovoltaic generator comprises measuring a power value of the electrical power generated by the photovoltaic generator. The power value may be the electrical power itself calculated from a current generated by the photovoltaic generator and the output voltage thereof by multiplication, or other values correlated with the electrical power. By way of example, this may be the generated current, particularly if the output voltage is constant, or the output voltage, particularly if the generated current is constant. A constant output voltage or a constant generated current may be predefined by an inverter connected to the photovoltaic generator.

The method according to the disclosure comprises determining temporal profiles of the measured power values that are associated with shadow edges migrating across the photovoltaic generator taking account of edge direction and edge transverse speed of the respective shadow edge. This means that the external cause of the respective profile of the measured power values, namely the migration of the respective shadow edge over the photovoltaic generator, is taken into account as accurately as possible in order to be able to correlate the internal cause of the profile, i.e. the power density distribution of interest. By the method according to the disclosure the power density distribution of interest may be reconstructed from the temporal profiles of the measured power values that have been evaluated for different edge directions. Although only a one-dimensional power density distribution normal to the respective edge direction, i.e. in the direction of the edge transverse speed, can be determined from each individual temporal profile, taking account of different edge directions makes it possible to resolve the areal power density distribution.

The edge direction here denotes the direction along which the respective shadow edge extends. The edge transverse speed runs normally, i.e. orthogonally, with respect to the edge direction. The edge transverse speed is therefore only that component of the speed of a shadow-casting object projected onto the photovoltaic generator which runs normally or orthogonally with respect to the edge direction.

In particular, in the method according to the disclosure, the temporal profiles of the measured power values, taking into account the edge transverse speed, are converted into profiles dependent on the location of the respective shadow edge with the respective edge direction. Thus it is possible to measure and evaluate a change in the measured power value that occurs with the location of the respective shadow edge in the direction of the edge transverse speed. Expressed mathematically, the change then evaluated is the first derivative of the respective location-dependent profile of the power values with respect to the location. In principle, however, the edge transverse speed may also be taken into account differently and a change in the respective temporal profile of the measured power values with time may be evaluated. Expressed mathematically, this is the first derivative with respect to time of the temporal profile of the measured power values. The respective change in the measured power values corresponds to the change of the power of the photovoltaic generator in its region swept over by the shadow edge. Therefore, if the change is large, the performance of the photovoltaic generator in this region is high; if the change is small, the performance there is low.

In concrete terms, in one embodiment each change in the measured power value that occurs with the location of the respective shadow edge in the direction of the edge transverse speed is evaluated by computed tomography with regard to the power density distribution of the photovoltaic generator analogously to the absorption of a measurement beam seen at the location of the respective shadow edge in the respective edge direction. In other words, the changes in the measured power value that are assigned to specific alignments and locations of the respective shadow edge can be evaluated according to computed tomography evaluation algorithms which were developed for evaluating absorptions of a measurement beam measured for specific alignments and locations in order to determine the absorption density distribution of an object therefrom. Numerous evaluation algorithms of this type are available, in particular also in very robust embodiments having low sensitivity to suboptimum detection conditions of the evaluated measurement values.

In one embodiment, changes in the measured power value that occur over each profile of the measured power values are normalized to a total change in the power value that occurs across the respective profile. This may be realized by dividing all changes by the difference between the power value for a completely unshaded photovoltaic generator and a completely shaded photovoltaic generator. If only changes in the measured power value are considered, a value shift by the power value of the completely shaded photovoltaic generator is omitted. However, if the intention is to consider the profile of the measured power value as such and to effect normalization with respect thereto, thus the power value for a completely shaded photovoltaic generator should be subtracted from the measured power value and then the result of the subtraction is divided by the total change.

The edge direction of the respective shadow edge may be determined e.g. by means of a camera, from temporal profiles of signals of a plurality of punctiform radiation sensors in an identified arrangement, from temporal profiles of the measured power data of a plurality of photovoltaic generators in an identified arrangement, and/or from weather data provided externally. In this case, it is possible to have recourse to methods such as are known from DE 10 2010 037 582 A1. In this case, the arrangement of the plurality of punctiform radiation sensors or photovoltaic generators need only be known modulo mirrorings, rotations and compressions, insofar as determining the edge direction of the respective shadow edge is exclusively involved. If an edge transverse speed of the respective shadow edge is also intended to be deduced on the same database, the respective arrangement must, however, be completely known.

The edge transverse speed of the respective shadow edge may also be deduced from the temporal profile of the measured power values that is associated with the respective shadow edge migrating across the photovoltaic generator. This holds true at least when the dimensions of the photovoltaic generator are known. Conversely, the dimensions of the photovoltaic generator may be determined in the context of the method according to the disclosure just like the alignment of the photovoltaic generator if edge transverse speeds of the shadow edges are known on the basis of other information.

In one embodiment of the method according to the disclosure an edge quality comprising a measure of the edge straightness and/or a measure of the edge contrast is determined. This may be achieved by means of a camera, from temporal profiles of signals of a plurality of punctiform radiation sensors in a known arrangement, and/or from temporal profiles of the measured power values of a plurality of photovoltaic generators in an identified arrangement, and/or also from the profile of the measured power value of the respective photovoltaic generator itself. In this embodiment of the method according to the disclosure, the temporal profile of the measured power values that is associated with the respective shadow edge migrating across the photovoltaic generator is evaluated with regard to the power density distribution of the photovoltaic generator if the edge quality attains a predefined minimum value. This ensures the meaningfulness of the method according to the disclosure, wherein it is precisely of importance what performance the photovoltaic generator has in the present region of the shadow edge, which can be derived from the measured power values if the associated position of the shadow edge is accurately defined. The edge straightness and the edge contrast evidently affect not just the meaningfulness of the method according to the disclosure, they may thus be measured and assessed on the basis of their effects for example on the profiles of measured power values of a plurality of photovoltaic generators in an identified arrangement.

In the method according to one embodiment of the disclosure, it is possible to evaluate not only the temporal profiles of the measured power values that are associated with leading shadow edges, e.g. front edges of clouds, but also the temporal profiles of the measured power values that are associated with trailing shadow edges, e.g. with rear edges of clouds. In an identical edge quality, the temporal profiles of the measured power values in both cases are of identical meaningfulness with regard to the power density distribution of the photovoltaic generator of interest. The respective leading or trailing shadow edge may be not only of natural origin, i.e. caused in particular by a cloud. A shadow edge of an artificial shading, such as that caused for example by a cover opaque to light, may also be involved.

Alternatively or additionally, temporal profiles of the measured power values may be evaluated which are associated with a light band delimited by a trailing shadow edge and a leading shadow edge parallel thereto and/or which are associated with a shadow band delimited by a leading shadow edge and a trailing shadow edge parallel thereto, if the light and/or the shadow band are led in different directions over the photovoltaic generator. Such a light or shadow band occurs rarely as a natural event and therefore generally has to be brought about artificially with two large-area covers spaced apart in a parallel fashion or one narrow cover.

In one embodiment of the method according to the disclosure, power density distributions determined for the photovoltaic generator at different time intervals are compared with one another. Differences between the power density distributions, i.e. local decreases in the power density that occurred over time, for example, indicate local shadings by displaced, installed or grown objects, impurities or defects. With the method according to the disclosure, these events may be localized such that they can be fixed in a targeted manner by, e.g. cleaning or repair.

In the case of local dips in the power density distribution relative to a power density distribution that is not measured, but rather expected on the basis of other data, in the method according to the disclosure this may result in the outputting of indications of defective parts of the photovoltaic generator at specific locations of the photovoltaic generator. In this regard, for example, absence of a solar cell which should be present may also be established.

If dependencies of the determined power density distribution on the position of the sun are determined, different alignments of the solar modules of the photovoltaic generator may be identified and determined. The power of a solar module varies with the irradiation angle, i.e. the angle of incidence of the sunrays, and has a maximum for perpendicular incidence of the sunlight. The solar modules which have the highest power density for a power density distribution at a respective position of the sun are aligned in the most expedient irradiation angle. In addition, from the dependencies of the determined power density distribution on the position of the sun, it is possible to establish, for example, local shadings of the photovoltaic generator by shadow-casting objects which are situated in proximity to said photovoltaic generator and which have an effect only when the sun is at low altitude.

The method according to the disclosure makes it possible for the first time to ascertain the power density distribution of the photovoltaic generator from power values that are measured for the respective photovoltaic generator in its entirety. In this respect, a power density distribution determined from such measurements is new.

Correspondingly, a monitoring device according to the disclosure for a photovoltaic generator of planar extent measures a power value of the electrical power generated by the photovoltaic generator. The monitoring device determines a power density distribution of the photovoltaic generator from the measured power values. In particular, the monitoring device according to the disclosure ascertains the power density distribution of the photovoltaic generator from the measured power values according to the method according to the disclosure. The power density distribution may then be calibrated with a reference value, for example a power density distribution measured earlier, in order to establish differences that indicate faults with spatial resolution.

The present disclosure is applicable to photovoltaic generators of very different sizes. It allows the determination of a power density distribution of the respective photovoltaic generator with high spatial resolution both in the case of small-area photovoltaic generators and in the case of large-area photovoltaic generators. In this regard, a photovoltaic generator can comprise just a single solar module or a plurality of series circuits of solar modules combined in parallel-connected strings. The determination of the power density distribution of relatively small photovoltaic generators presupposes the presence of relatively sharp shadow edges. In the case of large photovoltaic generators, the respective power value has to be registered with higher relative resolution. For the implementation of the present disclosure, however, the measurement of a single power value actually suffices to be able to determine the power density distribution of a photovoltaic generator when taking account of shadow edges with different edge directions. The disclosure can therefore easily be implemented for monitoring already existing photovoltaic generators, without investment in sensors or other monitoring equipment being necessary for this purpose.

Advantageous developments of the disclosure are evident from the patent claims, the description and the drawings. The advantages of features and of combinations of a plurality of features as mentioned in the description are merely by way of example and may take effect alternatively or cumulatively, without the advantages necessarily having to be afforded by embodiments according to the disclosure. Without the subject matter of the accompanying patent claims being altered thereby, the following holds true with regard to the disclosure content of the original application documents and of the patent: further features can be gathered from the drawings—in particular the illustrated geometries and the relative dimensions of a plurality of component parts with respect to one another and the relative arrangement and operative connection thereof. The combination of features of different embodiments of the disclosure or of features of different patent claims is likewise possible in a departure from the chosen dependency references of the patent claims and is suggested hereby. This also concerns such features which are illustrated in separate drawings or are mentioned in the description thereof: These features can also be combined with features of different patent claims. It is likewise possible to omit features presented in the patent claims for further embodiments of the disclosure.

The features mentioned in the patent claims and the description should be understood, with regard to their number, such that exactly this number or a greater number than the number mentioned is present, without the need for explicit use of the adverb "at least". Therefore, if an element is mentioned, for example, this should be understood to mean that exactly one element, two elements or more elements are present. These features can be supplemented by other features or be the sole features of which the respective product consists.

The reference signs contained in the patent claims do not restrict the scope of the subjects protected by the patent claims. They merely serve the purpose of making the patent claims more easily understood.

BRIEF DESCRIPTION OF THE DRAWINGS

The disclosure is explained and described in further detail below on the basis of preferred exemplary embodiments illustrated in the Figures.

DETAILED DESCRIPTION

The power density distribution of a photovoltaic generator should be understood as a distribution with which the capability of the photovoltaic generator to convert light into electrical power is distributed over the two-dimensional horizontal extension of the photovoltaic generator. A relative measure of the capability of the photovoltaic generator to convert light into electrical power is the electrical power generated in each area element of the horizontal extension of said photovoltaic generator in the case of homogeneous insolation over the entire photovoltaic generator. Variations of this power density result, for example, from solar cells arranged with different densities in different regions of the photovoltaic generator, to a smaller degree from fluctuations in performance between the individual solar cells and, this being of particular interest, from faults and defects from individual or a plurality of solar cells or solar modules. In this regard, determining the power density distribution in a photovoltaic generator may serve, in particular, for identifying such faults or defects, irrespective of them being present from the outset or whether they do occur in the course of the operation of the photovoltaic generator.

The drifting of clouds above a photovoltaic generator leads to an attenuation of the electrical power generated by the photovoltaic generator. The measure of the attenuation between maximum power without any shading of the photovoltaic generator and minimum power with total shading of the photovoltaic generator is approximately proportional to the proportion of the area of the solar modules of the photovoltaic generator which are shaded by a cloud shading the photovoltaic generator at the respective point in time. The proportionality applies strictly to a homogeneous distribution of the capability of the solar modules of the photovoltaic generator to convert light into electrical power. Conversely, deviations from proportionality contain information about inhomogeneities of the capability of the photovoltaic generator to convert light into electrical power. This is utilized by the present disclosure to determine the distribution of the capability, which is also referred to here as power density distribution.

Figure 1:
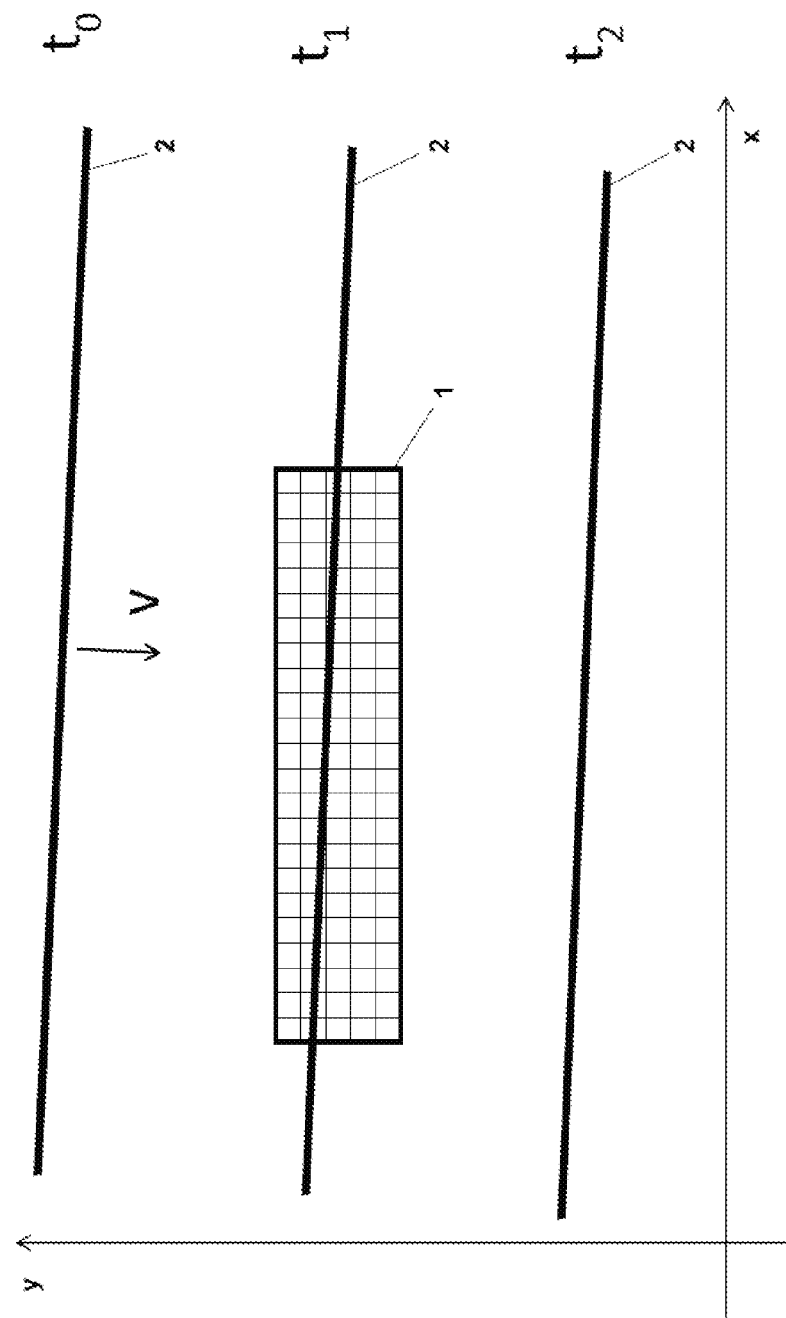
FIG. 1 schematically illustrates the migration of a shadow edge caused by a cloud over a photovoltaic generator.

FIG. 1 schematically illustrates a photovoltaic generator 1 having an extent in the x-y-plane. The photovoltaic generator 1 is swept over by a shadow edge 2 propagating at an edge transverse speed V normally to its extension in the x-y-plane. In this case, the shadow edge 2 is the leading shadow edge of a cloud having a larger extent, the cloud not being illustrated here. At a point in time $t_0$, the shadow edge 2 has not yet reached the photovoltaic generator 1. At said point in time $t_0$, therefore, the photovoltaic generator 1 is still totally unshaded. At the point in time $t_1$, the shadow edge 2 extends over the photovoltaic generator 1, with the result that the latter is partly shaded. At the point in time $t_2$, the shadow edge 2 has already migrated completely across the photovoltaic generator 1, with the result that the latter is now completely shaded by the following cloud.

Figure 2:
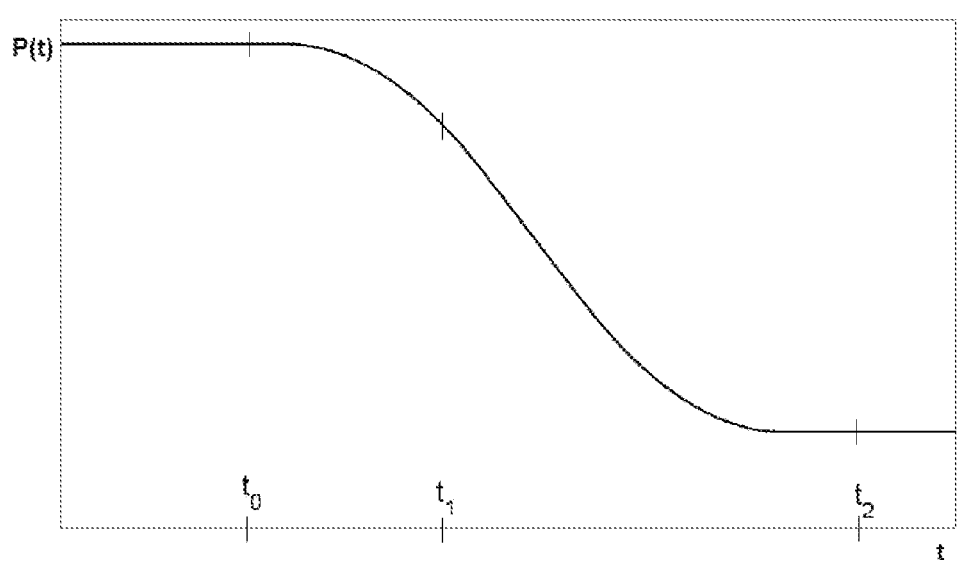
FIG. 2 illustrates the temporal profile of the electrical power output by the photovoltaic generator in accordance with FIG. 1 while the shadow edge migrates across said photovoltaic generator in accordance with FIG. 1.

FIG. 2 illustrates the profile of the electrical power P of the photovoltaic generator 1 over time t, the profile resulting from the migration of the shadow edge 2 in accordance with FIG. 1, wherein the points in time $t_0$, $t_1$ and $t_2$ are marked. At the point in time $t_0$, the power of the photovoltaic generator is at a maximum. At the point in time $t_1$, it has already partly decreased owing to the partial shading of the photovoltaic generator 1. At the point in time $t_2$, it has decreased to the minimum power of the photovoltaic generator 1 with total shading.

Figure 3:
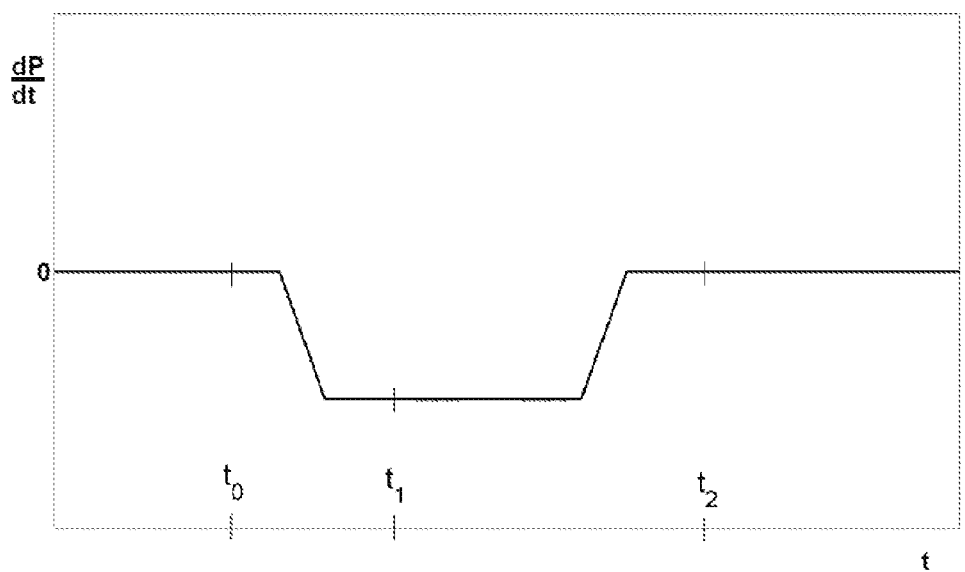
FIG. 3 is a plot of the change in the power in accordance with FIG. 2 over time.

FIG. 3 is a plot of the change in the power P in accordance with FIG. 2 over time, i.e. the derivative of the power P(t) in accordance with FIG. 2 with respect to time. The change increases after $t_0$ until the shadow edge 2 in accordance with FIG. 1 covers the entire width of the photovoltaic generator 1 in the x-direction. It then remains at a constant value in the assumed case of a homogeneous power density distribution until it returns to zero again. The change in the power over time as plotted in FIG. 3 is used in the method according to the disclosure, taking account of the edge transverse speed V and the alignment of the shadow edge 2 in accordance with FIG. 1, in order to ascertain the position and moreover the power density distribution of the photovoltaic generator 1.

Computed tomography evaluation techniques, in particular, are employed in this case. The comparability of the change in the power in accordance with FIG. 3 with the measurement signal in the case of a computed tomography measurement set-up, specifically a measurement set-up for transmission tomography, is illustrated by FIGS. 4 and 5.

Figure 4:
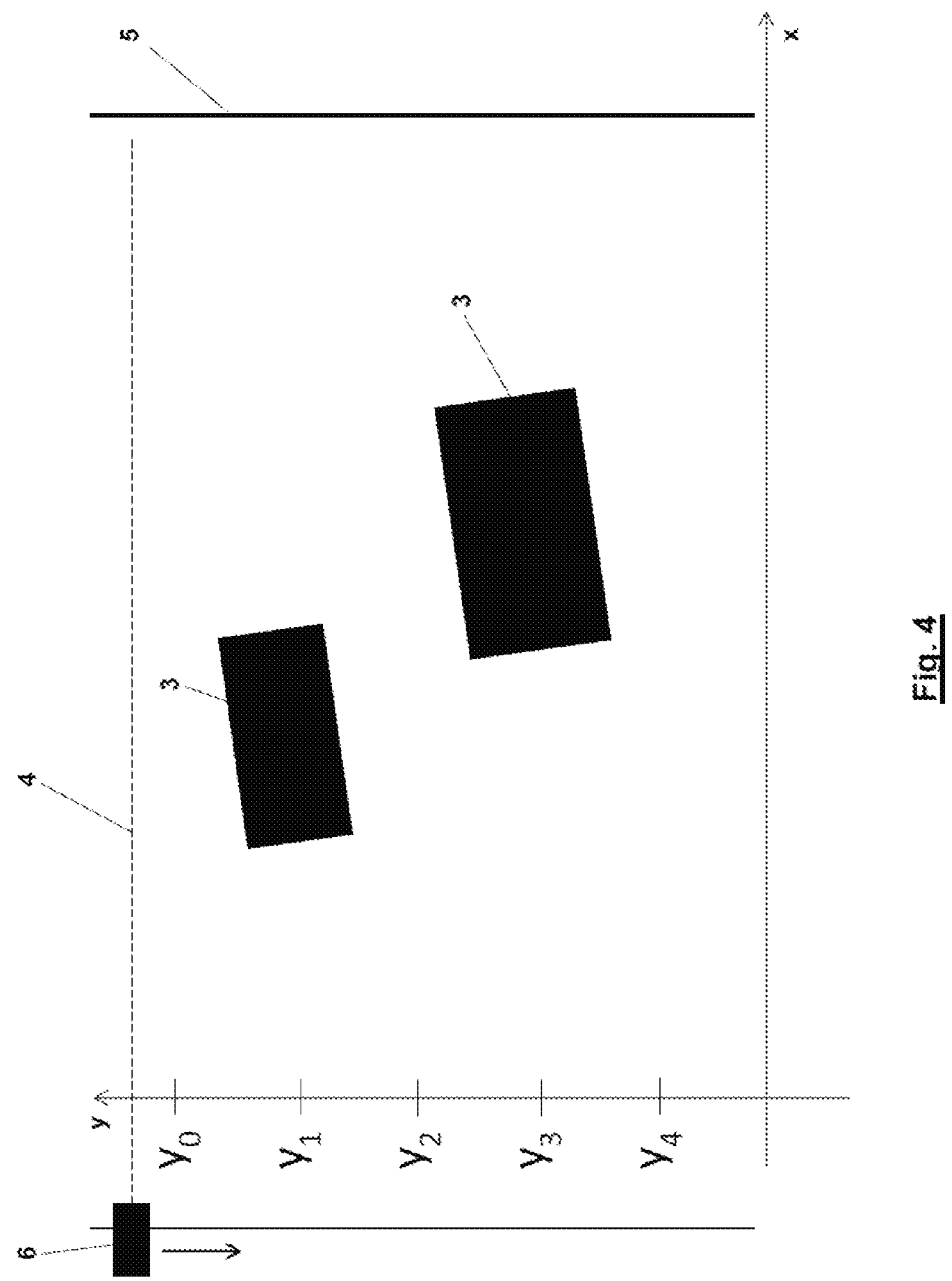
FIG. 4 illustrates a measurement set-up for a computed tomography method according to the prior art.

FIG. 4 illustrates how, in transmission tomography, objects 3 of interest are scanned with the measurement beam 4, wherein the transmitted proportion I of the measurement beam 4 is registered by a radiation sensor 5. The measurement signal is the attenuation $I_0$-I of the measurement beam 4 caused by the absorptivity of the respective object 3, wherein $I_0$ is the initial intensity of the measurement beam 4. If a radiation source 6 that emits the measurement beam 4 is displaced in the y-direction, as shown in FIG. 4, the profile of the attenuation $I_0$-I, as illustrated in FIG. 5 results on account of the absorption density distributions of the objects 3 at the locations $y_1$ and $y_3$, the absorption density distributions being assumed to be homogeneous. In this case, the profile of the attenuation $I_0$-I mirrors the shape of the objects in the x-y-plane in accordance with FIG. 4 and the absorptivity distribution thereof. FIG. 4 illustrates two objects 3 having the typical rectangular dimensions of a photovoltaic generator, which are slightly tilted relative to the direction of the measurement beam 4. Exactly as in the case of the power change in accordance with FIG. 3 on account of the shadow edge 2 tilted slightly relative to the photovoltaic generator 1 in accordance with FIG. 1, this results in a profile of the measurement signal in accordance with FIG. 5 that exactly mirrors the profile of the change in the power in accordance with FIG. 3.

Figure 5:
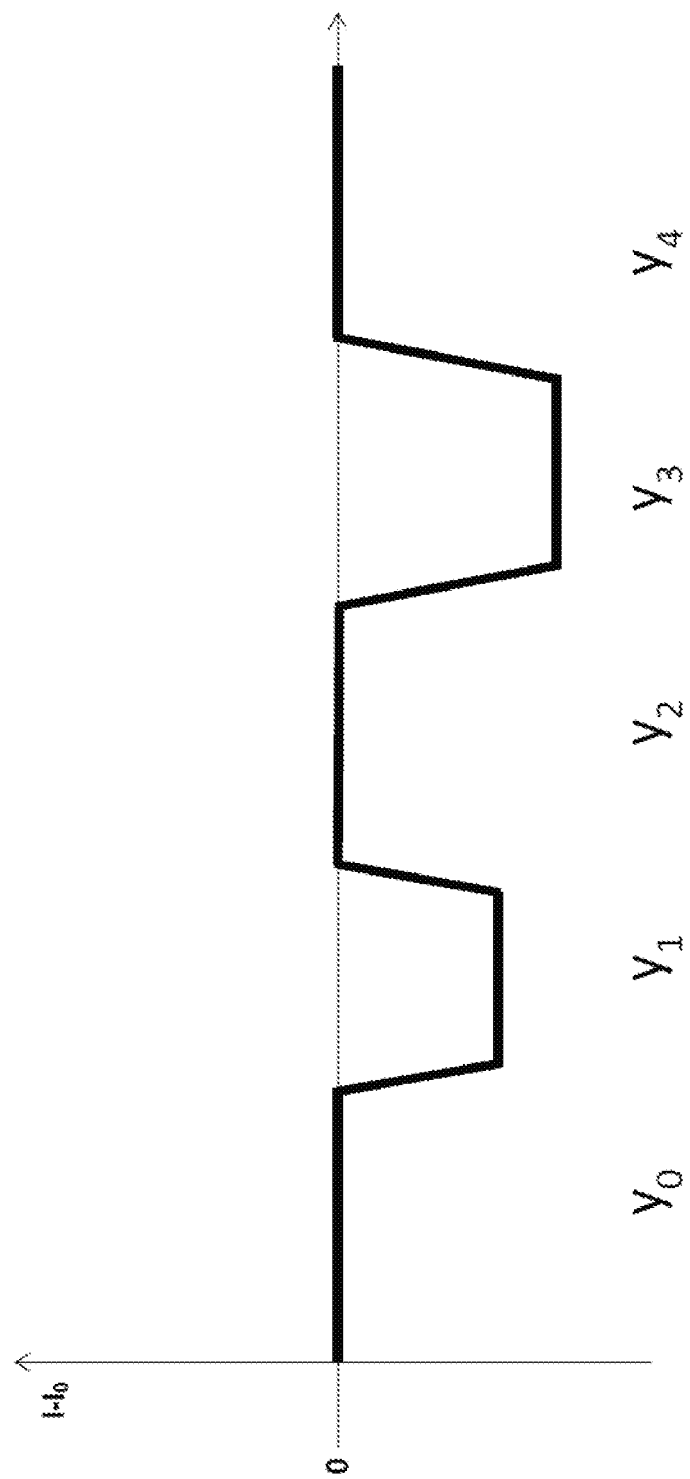
FIG. 5 illustrates a measurement signal measured by the set-up in accordance with FIG. 4.

In the same way as an absorption density distribution of the objects 3 in accordance with FIG. 4 can be determined from the measurement signal $I_0$-I in accordance with FIG. 5 together with corresponding measurement signals with different alignment of the measurement beam 4 in accordance with FIG. 4 according to computed tomography techniques, it is possible, taking account of shadow edges 2 having different alignments, to ascertain the power density distribution of the photovoltaic generator 1 from the resulting changes in the power in accordance with FIG. 3.

In concrete terms, computed tomography proceeds from the following relationship between the absorption density distribution f(x,y) and the measured attenuation $g(\theta,r)=I_0$-I $(\theta,r)$, wherein $\theta$ is the angle, i.e. the direction, of the measurement beam 4, r is the position of the measurement beam 4 in the transverse direction and $\delta$ is the Dirac function:

$$g(\theta,r)=\iint f(x,y)\delta(-x^*\cos(\theta)-y^*\sin(\theta)+r)dxdy$$

f(x,y) can be reconstructed with the aid of a series of measurements for different values $g(\theta,r)$. In this case, there are a large number of construction methods for solving this problem, see "Mathematical Methods in Image Reconstruction" by Frank Natterer and Frank Wübbeling, which is hereby incorporated by reference.

Figure 6:
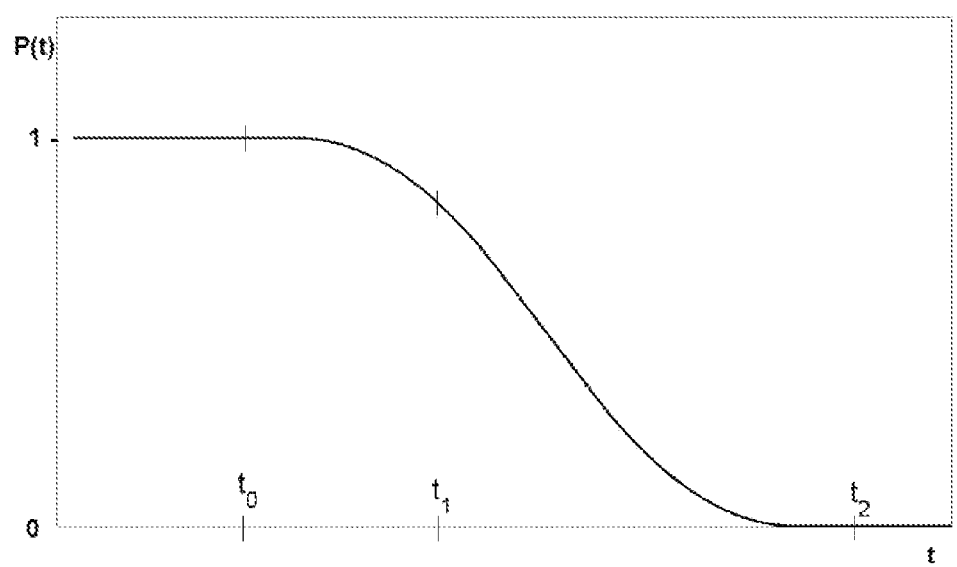
FIG. 6 shows the temporal profile of the electrical power in accordance with FIG. 2 after normalization.

If the profile—shown in FIG. 2—of the power between the maximum power at the point in time $t_0$ and the minimum power at the point in time $t_2$ is normalized to 1 to 0, as is illustrated in FIG. 6, the following relationship holds true for the change over time in this normalized $\tilde{P}$ with respect to the power density distribution f(x,y) of the photovoltaic generator:

$$\frac{d\tilde{P}}{dt}(t) = \int_{-\infty}^{+\infty}\int_{-\infty}^{+\infty} f(x,y)\delta(-x*\cos(\gamma(t)) - y*\sin(\gamma(t)) + r(t))dxdy$$

In this case, $\delta$ is once again the Dirac function, $\gamma(t)$ is the angle of the respective shadow edge 2, that is to say that it indicates the edge direction, and r(t) indicates the present location of the cloud front in the form of a displacement that can be determined from the edge transverse speed V. Using the computed tomography techniques known from, for example, "Mathematical Methods in Image Reconstruction" by Frank Natterer and Frank Wübbeling, it is possible to determine on this basis, from the change in the normalized power over time, the power density distribution f(x,y) of the photovoltaic generator taking account of different shadow edges with a different angle $\delta(t)$.

Figure 7:
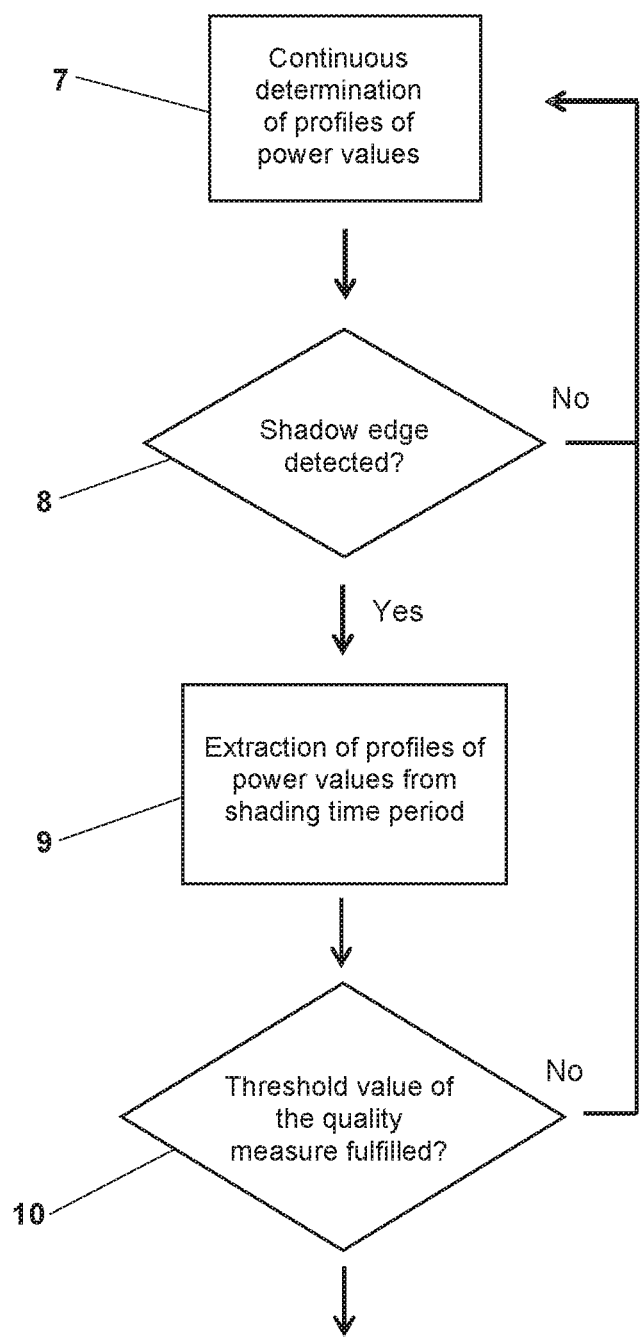
FIG. 7 shows a flow diagram of the method according to the disclosure.
Figure 7:
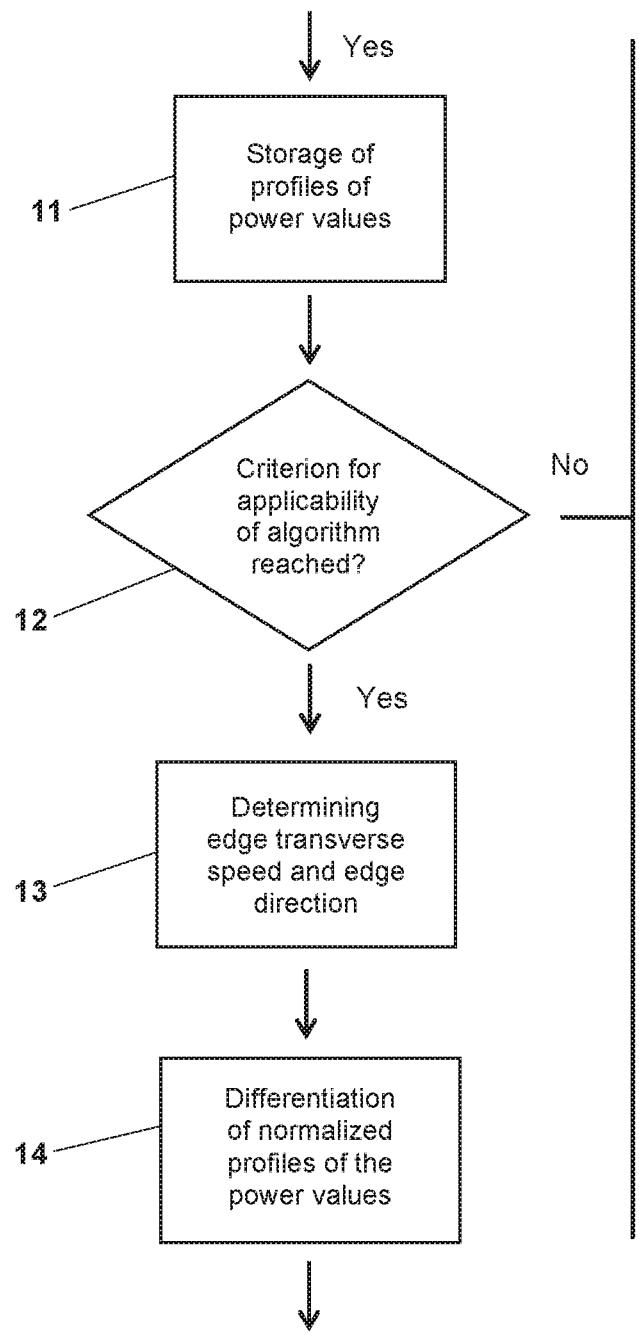

The flow diagram of the method according to the disclosure as shown in FIG. 7 begins at 7 with the continuous determination of temporal profiles of the respective measured power values of the electrical power of the photovoltaic generator. At 8 it is continuously checked whether a shadow edge is detected, for example by means of a camera or by evaluation of the temporal profiles of the power values. If a shadow edge is detected, the temporal profiles of the power values that are correlated with the shadow edge are extracted at 9. A subsequent act 10 involves checking whether the shadow edge and correspondingly also the resulting temporal profile of the power values satisfy a threshold value of a quality measure. Particularly, in one embodiment, the rectilinearity of the shadow edge and also the shadow contrast determine the quality measure. The evaluation of a temporal profile of the power values is expedient if a shadow edge having a minimum rectilinearity and a minimum contrast is present. In this case, the respective profile of the power values is stored at 11. If a sufficient number of such profiles have been stored in the case of a check at 12, an evaluation with regard to the power density distribution of the photovoltaic generator 1 in accordance with FIG. 1 is possible using computed tomography methods. Act 13 involves determining the edge transverse speeds and edge directions associated with the temporal profiles of the power values. The profiles are then differentiated and normalized at 14, before the computed tomography evaluation is carried out at 15. A subsequent act 16 involves checking whether the power density distribution ascertained at 15 is already meaningful or could be erroneous; and a check is made whether further sufficiently accurate power density distributions are already present for a comparison. Act 17 involves a comparison between the present and a historical power density distribution. If a significant difference occurs here, indicating a fault in the photovoltaic generator, at 18 an alarm is output. The operator of the photovoltaic generator could receive an alarm message, for example. The entire method comprising acts 7 to 18, in one embodiment, as indicated in FIG. 7 can proceed as a continuous loop.

The invention claimed is:

1. A method for determining a power density distribution of a photovoltaic generator at a single location, comprising:
   measuring a power value of electrical power generated by the photovoltaic generator at the single location over a plurality of different time instances;
   determining temporal profiles of the measured power values associated with shadow edges of clouds moving across the photovoltaic generator at the single location using the measured power values over the plurality of different time instances;
   evaluating the determined temporal profiles of the measured power values with regard to an edge direction and an edge transverse speed of the respective shadow edges;

determining the power density distribution from multiple evaluations of temporal profiles of the measured power values for different edge directions at different time intervals;

comparing the determined power density distributions from different time intervals with one another; and outputting an indication about defective plots of the photovoltaic generator at specific locations of the photovoltaic generator in the event of a local dip in the power density distribution based on the comparison, wherein the local dip in the power density distribution indicates a local shading by a displaced, installed or grown object, or an impurity or defect in the photovoltaic generator, and the indication output communicates a fixed, targeted cleaning or repair request for a service technician.

2. The method according to claim 1, further comprising:
converting the temporal profiles of the measured power values, with regard to the edge transverse speed, into spatial profiles dependent on a location of the respective shadow edge with a respective edge direction; and
evaluating a change in the measured power value in coincidence with the location of the respective shadow edge and the direction of the edge transverse speed.

3. The method according to claim 2, further comprising:
evaluating the change in the measured power value that occurs with the location of the respective shadow edge in the direction of the edge transverse speed by a computed tomography method analogously to an absorption of a measurement beam seen at the location of the respective shadow edge in the respective edge direction.

4. The method according to claim 2, further comprising:
normalizing changes in the measured power value that occur over each profile of the measured power value to a total change in the power value that occurs across the profile.

5. The method according to claim 1, further comprising:
determining the edge direction of the respective shadow edge:
by means of a camera;
from temporal profiles of signals of a plurality of punctiform radiation sensors in a known arrangement;
from temporal profiles of the measured power values of a plurality of photovoltaic generators in a known arrangement; and/or
from weather data.

6. The method according to claim 1, further comprising:
determining an edge quality comprising a measure of an edge straightness and/or a measure of the edge contrast:
by means of a camera;
from temporal profiles of signals of a plurality of punctiform radiation sensors in a known arrangement; and/or
from temporal profiles of the measured power values of a plurality of photovoltaic generators in a known arrangement; and
determining the temporal profile of the measured power values that is associated with the respective shadow edge migrating across the photovoltaic generator if the edge quality attains a predefined minimum value.

7. The method according to claim 1, further comprising:
determining the edge transverse speed of the respective shadow edge:
by means of a camera;
from temporal profiles of signals of a plurality of punctiform radiation sensors in a known arrangement;
from temporal profiles of the measured power values of a plurality of photovoltaic generators in a known arrangement;
from the temporal profile of the measured power values that is associated with the respective shadow edge migrating across the photovoltaic generator; and/or
from weather data.

8. The method according to claim 1, further comprising:
determining the temporal profiles of the measured power values that are associated with leading and trailing shadow edges.

9. The method according to claim 1, wherein measuring a power value comprises:
determining a power value from measurements of a current generated by the photovoltaic generator and/or an output voltage provided by the photovoltaic generator.

10. The method according to claim 1, further comprising:
determining dependencies of the determined power density distribution on a position of the sun.

11. A monitoring device for a photovoltaic generator of planar extent that is configured to:
measure a power value of the electrical power generated by the photovoltaic generator at a plurality of different time instances,
determining temporal profiles of the measured power values at the plurality of different time instances associated with shadow edges of clouds moving across the photovoltaic generator;
evaluating the determined temporal profiles of the measured power values with regard to an edge direction and an edge transverse speed of the respective shadow edges;
determine a power density distribution of the photovoltaic generator from multiple evaluations of the temporal profiles of the measured power values for different edge directions associated with different time intervals,
compare the multiple determined power density distributions of the photovoltaic generator determined at different time intervals with one another; and
output an indication about defective plots of the photovoltaic generator at specific locations of the photovoltaic generator in the event of a local dip in the power density distribution based on the comparison, wherein the local dip in the power density distribution indicates a local shading by a displaced, installed or grown object, or an impurity or defect in the photovoltaic generator, and the indication output communicates a fixed, targeted cleaning or repair request for a service technician.

* * * * *